(12) United States Patent
Zhang et al.

(10) Patent No.: US 10,996,284 B2
(45) Date of Patent: May 4, 2021

(54) NOISE GENERATION CIRCUIT, SELF-CHECKING CIRCUIT, AFCI, AND PHOTOVOLTAIC POWER GENERATION SYSTEM

(71) Applicant: Huawei Technologies Co., Ltd., Shenzhen (CN)

(72) Inventors: Shengjie Zhang, Shanghai (CN); Jintao Han, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 225 days.

(21) Appl. No.: 16/233,440

(22) Filed: Dec. 27, 2018

(65) Prior Publication Data

US 2019/0154746 A1 May 23, 2019

Related U.S. Application Data

(63) Continuation of application No. PCT/CN2017/080516, filed on Apr. 14, 2017.

(30) Foreign Application Priority Data

Jul. 1, 2016 (CN) .......................... 201610510507.0

(51) Int. Cl.
*G01R 31/50* (2020.01)
*H02M 3/155* (2006.01)
(Continued)

(52) U.S. Cl.
CPC ............. *G01R 31/50* (2020.01); *G01R 31/14* (2013.01); *G01R 31/2827* (2013.01);
(Continued)

(58) Field of Classification Search
CPC .... G01R 31/50; G01R 35/00; G01R 31/2827; G01R 31/14; G01R 31/3275;
(Continued)

(56) References Cited

U.S. PATENT DOCUMENTS 5,565,818 A 10/1996 Robbins et al.
5,737,342 A 4/1998 Ziperovich
(Continued)

FOREIGN PATENT DOCUMENTS

CN 1196795 A 10/1998
CN 101114768 A 1/2008
(Continued)

*Primary Examiner* — Son T Le
(74) *Attorney, Agent, or Firm* — Leydig, Voit & Mayer, Ltd.

(57) ABSTRACT

This application provides a noise generation circuit, a self-checking circuit, an AFCI, and a photovoltaic power generation system. The noise generation circuit includes a power switch module, a noise generator, and a capacitor, where the noise generator is connected to both the power switch module and the capacitor; the power switch module is configured to control, according to a self-checking instruction, whether the noise generator generates a noise signal; and the capacitor is configured to filter out a direct current component in the noise signal when the noise generator generates the noise signal. According to the noise generation circuit, the self-checking circuit, the AFCI, and the photovoltaic power generation system that are provided in this application, no noise signal is generated in a non self-checking time, thereby ensuring normal working of the AFCI and the photovoltaic inverter.

13 Claims, 3 Drawing Sheets

(51) Int. Cl.
*G01R 35/00* (2006.01)
*H02M 3/10* (2006.01)
*G01R 31/28* (2006.01)
*G01R 31/14* (2006.01)
*G01R 31/327* (2006.01)
*H03B 29/00* (2006.01)
*H02S 40/30* (2014.01)
*H02S 50/10* (2014.01)
*H02H 1/00* (2006.01)
*H02H 3/16* (2006.01)

(52) U.S. Cl.
CPC ....... *G01R 31/327* (2013.01); *G01R 31/3275* (2013.01); *G01R 35/00* (2013.01); *H02H 1/0015* (2013.01); *H02H 3/16* (2013.01); *H02M 3/10* (2013.01); *H02M 3/155* (2013.01); *H02S 40/30* (2014.12); *H02S 50/10* (2014.12); *H03B 29/00* (2013.01); *G01R 31/2829* (2013.01)

(58) Field of Classification Search
CPC ............. G01R 31/327; G01R 31/2829; G01R 35/007; H02M 3/10; H02M 3/155; H03B 29/00; H02S 40/30; H02S 50/10; H02H 7/20; H02H 3/044; H02H 1/0015; H02H 3/16; Y02E 10/56
See application file for complete search history.

(56) References Cited

U.S. PATENT DOCUMENTS

| | | | |
|---|---|---|---|
| 6,433,977 | B1 | 8/2002 | MacBeth |
| 6,532,424 | B1* | 3/2003 | Haun .................. H01H 71/125 323/282 |
| 2007/0165342 | A1* | 7/2007 | Elms ........................ H02H 3/05 361/42 |
| 2009/0189615 | A1 | 7/2009 | Kinsel |
| 2012/0019966 | A1 | 1/2012 | Deboer |
| 2013/0181758 | A1 | 7/2013 | Buehler et al. |

FOREIGN PATENT DOCUMENTS

| | | |
|---|---|---|
| CN | 101266277 A | 9/2008 |
| CN | 101882867 A | 11/2010 |
| CN | 101925828 A | 12/2010 |
| CN | 103004047 A | 3/2013 |
| CN | 203054158 U | 7/2013 |
| CN | 204882846 U | 12/2015 |
| CN | 205178880 U | 4/2016 |
| CN | 105675966 A | 6/2016 |
| CN | 106199477 A | 12/2016 |
| DE | 3912654 A1 | 3/1990 |
| EP | 1731915 A1 | 12/2006 |
| EP | 2605405 A1 | 6/2013 |

* cited by examiner

NOISE GENERATION CIRCUIT, SELF-CHECKING CIRCUIT, AFCI, AND PHOTOVOLTAIC POWER GENERATION SYSTEM

CROSS-REFERENCE TO RELATED APPLICATIONS

This application is a continuation of International Application No. PCT/CN2017/080516, filed on Apr. 14, 2017, which claims priority to Chinese Patent Application No. 201610510507.0, filed on Jul. 1, 2016. The disclosures of the aforementioned applications are hereby incorporated by reference in their entireties.

TECHNICAL FIELD

This application relates to power source technologies, and in particular, to a noise generation circuit, a self-checking circuit, an arc fault circuit interrupter (AFCI), and a photovoltaic power generation system.

BACKGROUND

A photovoltaic power generation system is a power generation system of converting solar energy into electric energy. The photovoltaic power generation system is used as a power source in more sites due to advantages that the photovoltaic power generation system has a long service life, is environmentally friendly, and not only can generate electricity independently but also can implement grid connection. Currently, the photovoltaic power generation system mainly includes a plurality of solar cell panels, a photovoltaic inverter, and the like. The solar cell panels are connected to the photovoltaic inverter by using cables and wiring terminals.

In the prior art, a direct current arc fault easily occurs in the photovoltaic power generation system due to aging of the cables or unreliable connections of the wiring terminals. To avoid an electrical fire caused by the direct current arc fault in the photovoltaic power generation system, an AFCI used to detect a direct current arc is disposed in the photovoltaic inverter in the photovoltaic power generation system. The AFCI includes a detection circuit used to detect whether a direct current arc exists in the photovoltaic power generation system, and a self-checking circuit used to test whether the detection circuit functions normally. A noise generation circuit is disposed in the self-checking circuit. The noise generation circuit may generate a noise signal having a spectrum characteristic the same as that of an arc noise signal, so that the self-checking circuit can test, by outputting the noise signal to the detection circuit, whether the detection circuit can detect the noise signal, and determine, based on this, whether the detection circuit functions normally.

However, regardless of whether the self-checking circuit of the AFCI is in a state of testing whether the detection circuit functions normally, the noise generation circuit in the self-checking circuit generates noise signals constantly. As a result, the noise signals affect a component in the working AFCI and a component in the photovoltaic inverter of the AFCI, and the AFCI and the photovoltaic inverter cannot work normally.

SUMMARY

This application provides a noise generation circuit, a self-checking circuit, an AFCI, and a photovoltaic power generation system, to resolve a prior-art technical problem that regardless of whether a self-checking circuit of an AFCI is in a state of testing whether a detection circuit functions normally, a noise generation circuit in the self-checking circuit generates noise signals constantly, and as a result, the noise signals affect a component in the working AFCI and a component in a photovoltaic inverter of the AFCI, and consequently, the AFCI and the photovoltaic inverter cannot work normally.

According to a first aspect, this application provides a noise generation circuit. The noise generation circuit include a power switch module, a noise generator, and a capacitor, where the noise generator is connected to both the power switch module and the capacitor;

the power switch module is configured to control, according to a self-checking instruction, whether the noise generator generates a noise signal; and the capacitor is configured to filter out a direct current component in the noise signal when the noise generator generates the noise signal.

According to the noise generation circuit provided in the first aspect, after the noise generation circuit is disposed in a self-checking circuit of an AFCI in a photovoltaic power generation system, the power switch module of the noise generation circuit controls, only when receiving a self-checking instruction, the noise generator of the noise generation circuit to generate a noise signal having a spectrum characteristic the same as that of an arc noise signal. That is, the noise generation circuit in the self-checking circuit generates a noise signal only when the self-checking circuit tests a function of a detection circuit, that is, only after the photovoltaic power generation system is powered on and before an inverter works, and does not generate a noise signal in a non self-checking time, that is, when the AFCI and the photovoltaic inverter work normally. Therefore, according to the noise generation circuit provided in this application, no impact is imposed on a component in the AFCI in a working state or a component in a photovoltaic inverter of the AFCI, thereby ensuring normal working of the AFCI and the photovoltaic inverter, and improving working efficiency of the AFCI and the photovoltaic inverter.

Optionally, in a possible implementation of the first aspect, the power switch module includes a power source, a first resistor, a second resistor, a first switch, and a P-channel metal oxide semiconductor PMOS transistor; and a first terminal of the first resistor is connected to a first terminal of the first switch, a second terminal of the first switch is grounded, a third terminal of the first switch is connected to both a first terminal of the second resistor and a gate of the PMOS transistor, a second terminal of the second resistor and a source of the PMOS transistor both are connected to the power source, and a drain of the PMOS transistor is connected to the noise generator.

According to the noise generation circuit provided in this possible implementation, after the first resistor of the power switch module receives the self-checking instruction, the first switch of the power switch module may be connected by using a voltage obtained after the first resistor performs voltage division, to reduce a voltage on the gate of the PMOS transistor, so that the voltage on the gate of the PMOS transistor is less than a voltage on the source of the PMOS transistor, and further, the source and the drain of the PMOS transistor are connected. In this manner, the power source VCC of the power switch module can supply power, by using the source of the PMOS transistor, to the noise generator connected to the drain of the PMOS transistor, so that the noise generator can generate a noise signal, and the self-checking circuit can test, by using the noise signal, whether the detection circuit functions normally, thereby implementing a self-checking function of the self-checking circuit.

Optionally, in a possible implementation of the first aspect, the power switch module further includes a third resistor; and a first terminal of the third resistor is connected to both the first terminal of the first resistor and the first terminal of the first switch, and a second terminal of the third resistor is grounded.

According to the noise generation circuit provided in this possible implementation, the third resistor can release a charge accumulated when the first switch stops working, thereby improving stability of the first switch.

Optionally, in a possible implementation of the first aspect, the power switch module further includes a fourth resistor; and a first terminal of the fourth resistor is connected to the third terminal of the first switch, and a second terminal of the fourth resistor is connected to both the first terminal of the second resistor and the gate of the PMOS transistor.

According to the noise generation circuit provided in this possible implementation, the fourth resistor and the second resistor can share a voltage of the VCC together, so that the voltage on the gate of the PMOS transistor is equal to a voltage on the second terminal of the fourth resistor, thereby reducing the voltage on the gate of the PMOS transistor, and further connecting the PMOS transistor. Therefore, the power switch module can supply power to the noise generator by using the PMOS transistor, so that the noise generator generates a noise signal, and the self-checking circuit can test, by using the noise signal, whether the detection circuit functions normally, thereby implementing the self-checking function of the self-checking circuit.

Optionally, in a possible implementation of the first aspect, the first switch is a first NPN triode; and a base of the first NPN triode is the first terminal of the first switch, an emitter of the first NPN triode is the second terminal of the first switch, and a collector of the first NPN triode is the third terminal of the first switch.

Optionally, in a possible implementation of the first aspect, the first switch is an N-channel metal oxide semiconductor NMOS transistor; and a gate of the NMOS transistor is the first terminal of the first switch, a source of the NMOS transistor is the second terminal of the first switch, and a drain of the NMOS transistor is the third terminal of the first switch.

Optionally, in a possible implementation of the first aspect, the noise generator is a Zener diode; and a first terminal of the Zener diode is connected to both the drain of the PMOS transistor and a first terminal of the capacitor, and a second terminal of the Zener diode is grounded.

According to the noise generation circuit provided in this possible implementation, because the Zener diode may generate, in a normal working state, a shot noise signal having a spectrum characteristic the same as that of an arc noise signal, when the Zener diode is used as the noise generator of the noise generation circuit, the service life of the noise generator can be lengthened, and further, reliability of the noise generation circuit can be improved.

Optionally, in a possible implementation of the first aspect, the power switch module further includes a fifth resistor used for current limiting; and the first terminal of the Zener diode is connected to the drain of the PMOS transistor by using the fifth resistor.

According to the noise generation circuit provided in this possible implementation, the fifth resistor is disposed between the drain of the PMOS transistor and the Zener diode, so that a current passing through the Zener diode can be limited. Therefore, the Zener diode can be protected from being damaged by an excessively large current, thereby lengthening the service life of the Zener diode, and further, improving the reliability of the noise generation circuit.

Optionally, in a possible implementation of the first aspect, the noise generator is a second NPN triode; and an emitter of the second NPN triode is connected to the drain of the PMOS transistor, a base of the second NPN triode is connected to a first terminal of the capacitor, and a collector of the second NPN triode is not connected.

Optionally, in a possible implementation of the first aspect, the power switch module further includes a fifth resistor used for current limiting; and the emitter of the second NPN triode is connected to the drain of the PMOS transistor by using the fifth resistor.

According to the noise generation circuit provided in this possible implementation, the fifth resistor is disposed between the drain of the PMOS transistor and the second NPN triode, so that a current passing through the second NPN triode can be limited. Therefore, the second NPN triode can be protected from being damaged by an excessively large current, thereby lengthening the service life of the second NPN triode, and further, improving the reliability of the noise generation circuit.

Optionally, in a possible implementation of the first aspect, the noise generation circuit further includes a sixth resistor and an operational amplifier; and a first terminal of the sixth resistor is grounded, a second terminal of the sixth resistor is connected to both a second terminal of the capacitor and a non-inverting input terminal of the operational amplifier, and an output terminal of the operational amplifier is connected to an inverting input terminal of the operational amplifier.

According to the noise generation circuit provided in this possible implementation, by using the sixth resistor connected to the capacitor, the sixth resistor can release a charge accumulated when the capacitor stops working. In addition, by using the operational amplifier connected to the capacitor, the operational amplifier can isolate the capacitor from impedance in a filter amplifier circuit in the self-checking circuit, so that the capacitor can work in a normal state, and the capacitor can effectively remove the direct current component in the noise signal generated by the noise generator, thereby improving working efficiency of the capacitor.

According to a second aspect, this application provides a self-checking circuit. The self-checking circuit may include any noise generation circuit described above.

For a beneficial effect of the self-checking circuit provided in the second aspect, refer to the beneficial effect of the first aspect and any possible implementation of the first aspect, and details are not described herein again.

According to a third aspect, this application provides an AFCI. The AFCI may include the self-checking circuit described above.

For a beneficial effect of the AFCI provided in the third aspect, refer to the beneficial effect of the first aspect and any possible implementation of the first aspect, and details are not described herein again.

According to a fourth aspect, this application provides a photovoltaic power generation system. The photovoltaic power generation system may include the AFCI described above.

For a beneficial effect of the photovoltaic power generation system provided in the fourth aspect, refer to the beneficial effect of the first aspect and any possible implementation of the first aspect, and details are not described herein again.

According to the noise generation circuit, the self-checking circuit, the AFCI, and the photovoltaic power generation system that are provided in this application, after the noise generation circuit is disposed in the self-checking circuit of the AFCI in the photovoltaic power generation system, the power switch module of the noise generation circuit controls, only when receiving a self-checking instruction, the noise generator of the noise generation circuit to generate a noise signal having a spectrum characteristic the same as that of an arc noise signal. That is, the noise generation circuit in the self-checking circuit generates a noise signal only when the self-checking circuit tests a function of the detection circuit, that is, only after the photovoltaic power generation system is powered on and before an inverter works, and does not generate a noise signal in a non self-checking time, that is, when the AFCI and the photovoltaic inverter work normally. Therefore, according to the noise generation circuit provided in this application, no impact is imposed on the component in the AFCI in a working state or the component in the photovoltaic inverter of the AFCI, thereby ensuring normal working of the AFCI and the photovoltaic inverter, and improving the working efficiency of the AFCI and the photovoltaic inverter.

DESCRIPTION OF EMBODIMENTS

Using an AFCI in a photovoltaic power generation system as an example, in the prior art, the AFCI is disposed in a photovoltaic inverter in the photovoltaic power generation system, and the AFCI may include a detection circuit used to detect whether a direct current arc exists in the photovoltaic power generation system, and a self-checking circuit. The self-checking circuit may test, after the photovoltaic power generation system is powered on and before the photovoltaic inverter works, whether the detection circuit functions normally. A noise generation circuit in the self-checking circuit is connected to the detection circuit by using a switch module. The switch module is configured to connect the noise generation circuit to the detection circuit when the self-checking circuit tests a function of the detection circuit, so that the noise generation circuit in the self-checking circuit can output a noise signal having a spectrum characteristic the same as that of an arc noise signal to the detection circuit, and further, the self-checking circuit can determine, by testing whether the detection circuit can detect the noise signal, whether the detection circuit functions normally. However, regardless of whether the switch module is in a connected state, that is, regardless of whether the self-checking circuit tests a function of the detection circuit, the noise generation circuit in the self-checking circuit generates noise signals constantly. As a result, when the AFCI and the photovoltaic inverter of the AFCI work, the noise signals generated by the noise generation circuit in the self-checking circuit affect a component in the working AFCI and a component in the photovoltaic inverter of the AFCI, and the AFCI and the photovoltaic inverter cannot work normally.

According to a noise generation circuit provided in this application, after the noise generation circuit is disposed in a self-checking circuit of an AFCI in a photovoltaic power generation system, a power switch module of the noise generation circuit controls, only when receiving a self-checking instruction, a noise generator of the noise generation circuit to generate a noise signal having a spectrum characteristic the same as that of an arc noise signal. That is, the noise generation circuit in the self-checking circuit generates a noise signal only when the self-checking circuit tests a function of a detection circuit, that is, only after the photovoltaic power generation system is powered on and before an inverter works, and does not generate a noise signal in a non self-checking time, that is, when the AFCI and the photovoltaic inverter work normally. Therefore, according to the noise generation circuit provided in this application, no impact is imposed on a component in the AFCI in a working state or a component in the photovoltaic inverter of the AFCI, thereby ensuring normal working of the AFCI and the photovoltaic inverter. Therefore, the noise generation circuit provided in this application is intended to resolve a prior-art technical problem that regardless of whether a self-checking circuit of an AFCI is in a state of testing whether a detection circuit functions normally, a noise generation circuit in the self-checking circuit generates noise signals constantly, and as a result, the noise signals affect a component in a working AFCI and a component in a photovoltaic inverter of the AFCI, and the AFCI and the photovoltaic inverter cannot work normally.

Figure 1:
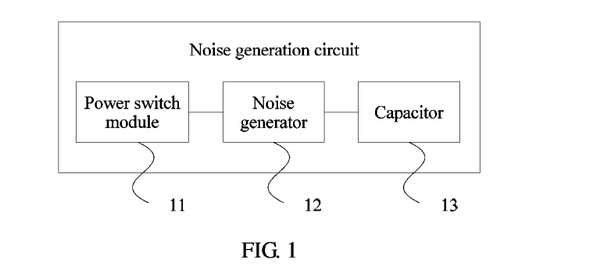
FIG. 1 is a schematic structural diagram of modules of a noise generation circuit according to this application.

FIG. 1 is a schematic structural diagram of modules of a noise generation circuit according to this application. As shown in FIG. 1, the noise generation circuit may include a power switch module 11, a noise generator 12, and a capacitor 13. The noise generator 12 is connected to both the power switch module 11 and the capacitor 13.

The power switch module 11 is configured to control, according to a self-checking instruction, whether the noise generator 12 generates a noise signal.

The capacitor 13 is configured to filter out a direct current component in the noise signal when the noise generator 12 generates the noise signal.

Specifically, the noise generation circuit may be disposed in a self-checking circuit of an AFCI in an inverter of a photovoltaic power generation system, and is configured to output a noise signal having a spectrum characteristic the same as that of an arc noise signal to a detection circuit when the self-checking circuit of the AFCI tests a function of the detection circuit.

The power switch module 11 included in the noise generation circuit may be any module having a receiving function, a connection function, a disconnection function, a power supply function, or the like. In this application, the power switch module 11 may receive the self-checking instruction, and supply power to the noise generator 12 when receiving the self-checking instruction, so that the noise generator 12 can generate a noise signal having a spectrum characteristic the same as that of an arc noise signal. In addition, the power switch module 11 stops supplying power to the noise generator 12 when the power switch module 11 does not receive the self-checking instruction, so that the noise generator 12 does not generate the noise signal, to avoid impact imposed by the noise signal on working of a component in the AFCI and a component in the photovoltaic inverter of the AFCI, thereby ensuring normal working of the AFCI and the photovoltaic inverter of the AFCI. The self-checking instruction may be any high-level signal whose voltage is greater than a working voltage of the power switch module 11, for example, a 5 V high-level signal, or a 3 V high-level signal. This may be specifically set according to the working voltage of the power switch module 11. During specific implementation, the self-checking instruction may be a self-checking instruction sent by a processor of the self-checking circuit of the AFCI, or a self-checking instruction generated when a maintenance person manually triggers a hardware switch (for example, a button) connected to the power switch module 11, or the like.

The noise generator 12 included in the noise generation circuit may be any component that can generate an analog arc noise signal, for example, a Zener diode, or an NPN triode. In this application, the noise generator 12 may generate, when the power switch module 11 receives the self-checking instruction, that is, when the power switch module 11 supplies power to the noise generator, a noise signal having a spectrum characteristic the same as that of an arc noise signal. The capacitor included in the noise generation circuit may be any capacitor having a function of coupling alternating current signals. In this application, when the noise generator 12 generates the noise signal, the capacitor may filter out the direct current component in the noise signal, so that the noise signal approaches an actual arc noise signal.

Figure 2:
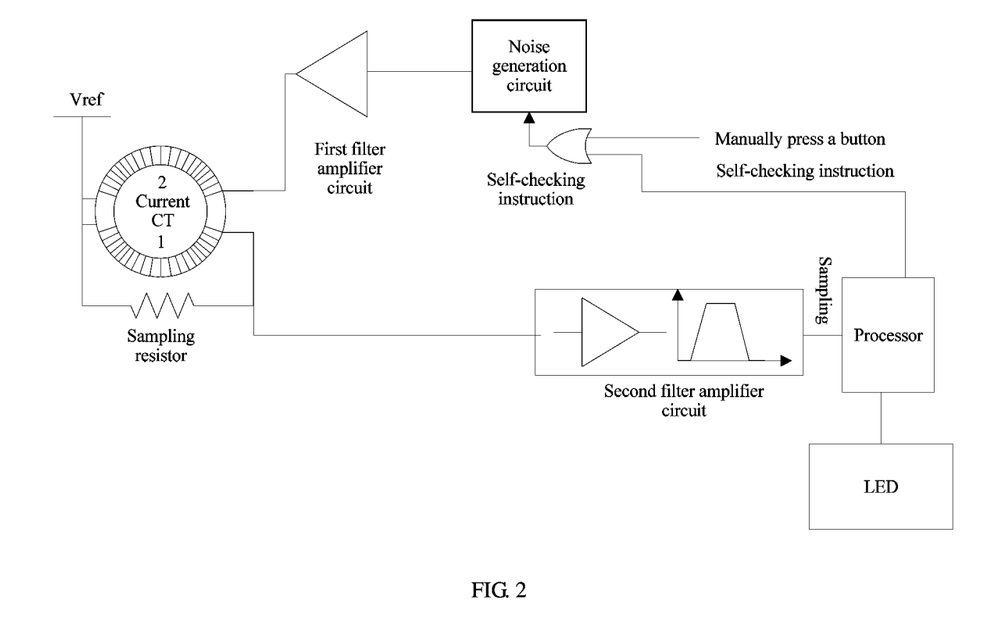
FIG. 2 shows a self-checking circuit of an AFCI according to this application.

The following describes an operating principle of the noise generation circuit provided in this application by using an example in which the noise generation circuit is disposed in a self-checking circuit of an existing AFCI. Specifically:

FIG. 2 shows a self-checking circuit of an AFCI according to this application. As shown in FIG. 2, the self-checking circuit of the AFCI may include a noise generation circuit, a first filter amplifier circuit, a button switch connected to the noise generation circuit, and a current transformer CT, a sampling resistor, a second filter amplifier circuit, a processor, and an LED lamp that are of a detection circuit. The CT may include a coil 1 and a coil 2. When the noise generation circuit provided in this application is disposed in the self-checking circuit of the AFCI shown in FIG. 2, a self-checking method of the AFCI may specifically include the following steps:

Step 1. After a photovoltaic power generation system is powered on, initialization setting, for example, system clock setting, interruption clock setting, analog to digital converter (ADC) sampling clock setting, or register initialization setting, may be performed on the processor of the detection circuit of the AFCI, so that the processor on which the initialization setting has been performed can detect an arc noise signal in the photovoltaic power generation system. After the initialization setting is completed, the processor of the detection circuit may send a self-checking instruction to a power switch module of the noise generation circuit in the self-checking circuit of the AFCI. Optionally, if the self-checking instruction is obtained through manual triggering, step 1 may be alternatively: After the photovoltaic power generation system is powered on, and the initialization setting is completed on the processor of the detection circuit of the AFCI, a maintenance person manually presses the button switch connected to the noise generation circuit, to send the self-checking instruction to the power switch module of the noise generation circuit in the self-checking circuit of the AFCI.

Step 2. The power switch module of the noise generation circuit in the self-checking circuit may supply power to a noise generator when receiving the self-checking instruction sent by the processor, so that the noise generator generates a noise signal having a spectrum characteristic the same as that of an arc noise signal, and the noise signal is output to the first filter amplifier circuit in the self-checking circuit by a capacitor after the capacitor filters out a direct current component in the noise signal.

Step 3. After receiving the noise signal output by the capacitor of the noise generation circuit, the first filter amplifier circuit in the self-checking circuit may perform filter amplification on the noise signal, so that a frequency and an amplitude of the noise signal are equal to or infinitely approach those of an actual arc noise signal; and output the noise signal on which the filter amplification has been performed to the coil 2 of the current CT of the detection circuit.

Step 4. Because the coil 1 and the coil 2 of the current CT of the detection circuit are two windings wound around a same magnetic core and having a same quantity of windings, the coil 1 and the coil 2 of the current CT may induce a same noise signal. Therefore, in this manner, the current CT may transfer, to the coil 1 of the current CT by using the coil 2 of the current CT, the noise signal output by the first filter amplifier circuit in the self-checking circuit, so that the sampling resistor connected in parallel to the coil 1 of the current CT can sample the noise signal and output the sampled noise signal to the second filter amplifier circuit in the detection circuit.

Step 5. The second filter amplifier circuit in the detection circuit further performs filter amplification on the received noise signal, so that a frequency and an amplitude of the noise signal are equal to or infinitely approach those of an actual arc noise signal; and outputs the noise signal on which the filter amplification has been performed to the processor of the detection circuit.

Step 6. After the processor of the detection circuit receives the noise signal output by the second filter amplifier circuit, the processor samples the noise signal by using an integrated ADC (for example, a high-speed ADC), and performs analysis to determine whether the noise signal satisfies a spectrum characteristic of an actual arc noise signal. In this case, if the processor determines that the sampled analog arc noise signal does not satisfy a spectrum characteristic of an actual arc, it indicates that one or more of the processor, the current CT, the sampling resistor, the second filter amplifier circuit, or the like of the detection circuit are damaged, that is, the detection circuit does not function normally, and the processor may send an instruction to the LED lamp, and light the LED lamp to indicate that self-checking of the AFCI fails. Alternatively, if the processor determines that the sampled analog arc noise signal satisfies a spectrum characteristic of an actual arc, it indicates that all of the processor, the current CT, the sampling resistor, the second filter amplifier circuit, and the like of the detection circuit function normally, that is, the detection circuit functions normally, and the processor stops sending the self-checking instruction to the noise generation circuit in the self-checking circuit, so that the noise generation circuit stops generating a noise signal, and further, the noise generation circuit stops outputting the noise signal to the detection circuit.

Step 7. After the processor of the detection circuit stops sending the self-checking instruction to the noise generation circuit in the self-checking circuit, that is, the noise generation circuit stops outputting the noise signal to the detection circuit, the processor may continue to sample a noise signal in the detection circuit by using the integrated high-speed AD, and perform analysis to determine whether the sampled noise signal satisfies a spectrum characteristic of an actual arc noise signal. In this case, if the processor determines that the sampled noise signal does not satisfy a spectrum characteristic of an actual arc noise signal, it indicates that all of the processor, the current CT, the sampling resistor, the second filter amplifier circuit, and the like of the detection circuit function normally, that is, the detection circuit functions normally, and the processor determines that self-checking of the AFCI succeeds. If the processor determines that the sampled noise signal satisfies a spectrum characteristic of an actual arc noise signal, because the photovoltaic power generation system does not start working in this case, in a normal working state, there is no possibility that an arc noise signal exists in the photovoltaic power generation system, that is, in the normal working state, the processor cannot obtain through sampling a noise signal satisfying a spectrum characteristic of an actual arc noise signal, it indicates that one or more of the processor, the current CT, the sampling resistor, the second filter amplifier circuit, or the like of the detection circuit do not function normally, that is, the detection circuit does not function normally, and the processor sends an instruction to the LED lamp, and lights the LED light to indicate that self-checking of the AFCI fails.

According to the noise generation circuit provided in this application, after the noise generation circuit is disposed in the self-checking circuit of the AFCI in the photovoltaic power generation system, the power switch module of the noise generation circuit controls, only when receiving a self-checking instruction, the noise generator of the noise generation circuit to generate a noise signal having a spectrum characteristic the same as that of an arc noise signal. That is, the noise generation circuit in the self-checking circuit generates a noise signal only when the self-checking circuit tests a function of the detection circuit, that is, only after the photovoltaic power generation system is powered on and before an inverter works, and does not generate a noise signal in a non self-checking time, that is, when the AFCI and the photovoltaic inverter work normally. Therefore, according to the noise generation circuit provided in this application, no impact is imposed on a component in the AFCI in a working state or a component in the photovoltaic inverter of the AFCI, thereby ensuring normal working of the AFCI and the photovoltaic inverter, and improving working efficiency of the AFCI and the photovoltaic inverter.

Figure 3:
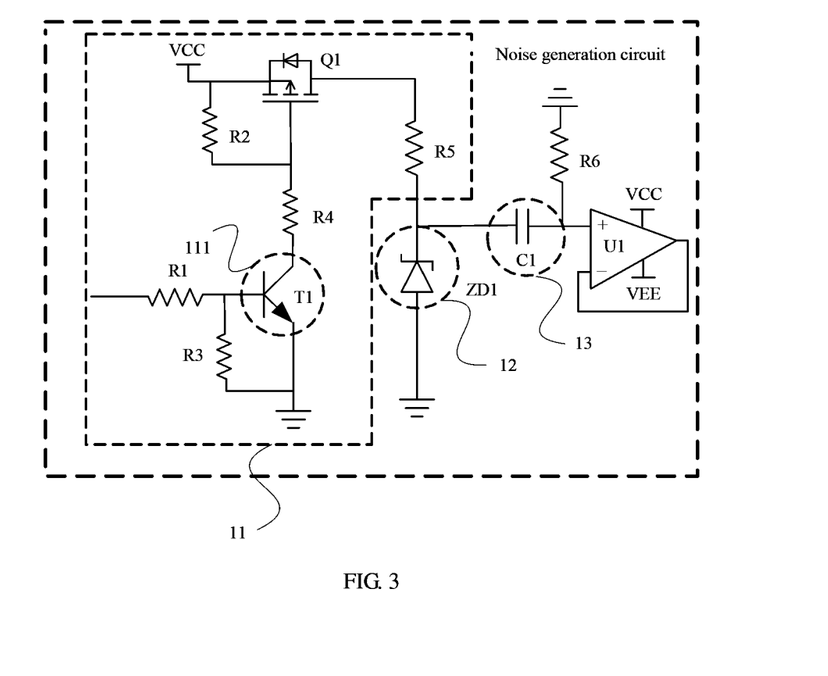
FIG. 3 is a circuit diagram of the noise generation circuit according to this application.

FIG. 3 is a circuit diagram of the noise generation circuit according to this application. As shown in FIG. 3, the power switch module 11 of the noise generation circuit may include a power source VCC, a first resistor R1, a second resistor R2, a first switch 111, and a PMOS transistor Q1.

A first terminal of the first resistor R1 is connected to a first terminal of the first switch 111, a second terminal of the first switch 111 is grounded, a third terminal of the first switch 111 is connected to both a first terminal of the second resistor R2 and a gate of Q1, a second terminal of the second resistor R2 and a source of Q1 both are connected to the power source, and a drain of Q1 is connected to the noise generator.

Specifically, the first resistor R1 may be a voltage division resistor, and the first resistor R1 may be connected to an output terminal of the processor or a button switch by using the second terminal of the first resistor, so that the first resistor R1 can receive a self-checking instruction, and when receiving a self-checking instruction in a form of a high-level signal, perform voltage division for the high-level signal, to reduce a voltage of the high-level signal. Therefore, the voltage approaches a working voltage of the first switch 111, to connect the first switch 111. The connected first switch 111 may cause the gate of Q1 to be grounded, to reduce a voltage on the gate of Q1, so that the voltage on the gate of Q1 is less than a voltage on the source of Q1, and further, the source and the drain of Q1 can be connected. In this manner, after the power switch module 11 receives the self-checking instruction, the power source VCC of the power switch module 11 can supply power, by using the source of Q1, to the noise generator 12 connected to the drain of Q1, so that the noise generator 12 can generate a noise signal having a spectrum characteristic the same as that of an arc noise signal, and the self-checking circuit can test, by using the noise signal, whether the detection circuit functions normally, thereby implementing a self-checking function of the self-checking circuit.

Continuing to refer to FIG. 3, optionally, in another implementation of this application, the power switch module 11 may further include a third resistor R3 used for voltage division. A first terminal of the third resistor R3 is connected to both the first terminal of the first resistor R1 and the first terminal of the first switch 111, and a second terminal of the third resistor R3 is grounded, so that the third resistor R3 can release a charge accumulated when the first switch 111 stops working, thereby improving stability of the first switch 111.

Continuing to refer to FIG. 3, optionally, in another implementation of this application, the power switch module 11 may further include a fourth resistor R4 used for voltage division. A first terminal of the fourth resistor R4 is connected to the third terminal of the first switch 111, and a second terminal of the fourth resistor R4 is connected to both the first terminal of the second resistor R2 and the gate of Q1, so that the fourth resistor R4 and R2 can share a voltage of the power source VCC together. Therefore, the voltage on the gate of Q1 is equal to a voltage on the second terminal of R4, thereby reducing the voltage on the gate of Q1, and further connecting the PMOS transistor. Therefore, the power switch module 11 can supply power to the noise generator by using the PMOS transistor, so that the noise generator generates a noise signal, and the self-checking circuit can test, by using the noise signal, whether the detection circuit functions normally, thereby implementing a self-checking function of the self-checking circuit.

Continuing to refer to FIG. 3, as shown in FIG. 3, the first switch 111 in the power switch module 11 may be any switch that can be connected when a working voltage is satisfied, for example, an NPN triode, or an NMOS transistor. Optionally, when the first switch 111 is a first NPN triode T1, a base B of T1 is the first terminal of the first switch 111, an emitter E of T1 is the second terminal of the first switch 111, and a collector C of T1 is the third terminal of the first switch 111. Optionally, when the first switch 111 is an NMOS transistor, a gate of the NMOS transistor is the first terminal of the first switch 111, a source of the NMOS transistor is the second terminal of the first switch 111, and a drain of the NMOS transistor is the third terminal of the first switch 111. The power switch module 11 shown in FIG. 3 is a power switch module whose first switch 111 is, for example, T1.

As described in the foregoing embodiment, the noise generator 12 included in the noise generation circuit may be any component that can generate an analog arc noise signal, for example, an NPN triode, or a Zener diode. Optionally, when the noise generator 12 is a second NPN triode, an emitter E of the second NPN triode may be connected to the drain of the PMOS transistor, a base B of the second NPN triode may be connected to a first terminal of a capacitor C1, and a collector C of the second NPN triode may be not connected, so that when the power switch module 11 supplies power to the second NPN triode, the second NPN triode may work in a reverse breakdown state, to generate a white noise signal having a spectrum characteristic the same as that of an arc noise signal. Optionally, when the noise generator 12 is a Zener diode ZD1, a first terminal of ZD1 is connected to both the drain of the PMOS transistor and a first terminal of a capacitor C1, and a second terminal of ZD1 is grounded, so that when the power switch module 11 supplies power to ZD1, that is, when ZD1 can work normally, ZD1 can generate a shot noise signal having a spectrum characteristic the same as that of an arc noise signal. Because ZD1 can generate, in a normal working state, a noise signal having a spectrum characteristic the same as that of an arc noise signal, when ZD1 is used as the noise generator 12 of the noise generation circuit, the service life of the noise generator 12 can be lengthened, and further reliability of the noise generation circuit can be improved. FIG. 3 shows the noise generation circuit 11 using the Zener diode ZD1 as the noise generator 12.

Continuing to refer to FIG. 3, optionally, the power switch module 11 may further include a fifth resistor R5 used for current limiting. R5 may be disposed between the drain of Q1 and the noise generator 12, and is configured to limit a current passing through the noise generator 12, so that the noise generator 12 can be protected from being damaged by an excessively large current, thereby lengthening the service life of the noise generator 12, and improving reliability of the noise generation circuit. Optionally, if the noise generator 12 is ZD1, when the power switch module 11 includes R5, the first terminal of ZD1 may be connected to the drain of the PMOS transistor by using R5. Optionally, if the noise generator 12 is the second NPN triode, when the power switch module 11 includes R5, the emitter E of the second NPN triode may be connected to the drain of the PMOS transistor by using R5.

Continuing to refer to FIG. 3, optionally, the noise generation circuit may further include a sixth resistor R6 and an operational amplifier U1. A first terminal of R6 is grounded, a second terminal of R6 is connected to both a second terminal of C1 and a non-inverting input terminal of U4, an output terminal of U1 is connected to an inverting input terminal of U1, so that R6 can release a charge accumulated when the capacitor C1 stops working, and U1 can isolate the capacitor from impedance in a filter amplifier circuit in the self-checking circuit. Therefore, C1 can work in a normal state, and C1 can effectively remove a direct current component in an analog arc noise signal generated by the noise generator, thereby improving working efficiency of C1.

According to the noise generation circuit provided in this application, after the noise generation circuit is disposed in the self-checking circuit of the AFCI in the photovoltaic power generation system, the power switch module of the noise generation circuit controls, only when receiving a self-checking instruction, the noise generator of the noise generation circuit to generate a noise signal having a spectrum characteristic the same as that of an arc noise signal. That is, the noise generation circuit in the self-checking circuit generates a noise signal only when the self-checking circuit tests a function of the detection circuit, that is, only after the photovoltaic power generation system is powered on and before an inverter works, and does not generate a noise signal in a non self-checking time, that is, when the AFCI and the photovoltaic inverter work normally. Therefore, according to the noise generation circuit provided in this application, no impact is imposed on a component in the AFCI in a working state or a component in the photovoltaic inverter of the AFCI, thereby ensuring normal working of the AFCI and the photovoltaic inverter, and improving working efficiency of the AFCI and the photovoltaic inverter.

It should be noted that although the foregoing embodiment describes, by using an example in which the noise generation circuit is disposed in the AFCI in the inverter in the photovoltaic power generation system, the noise generation circuit provided in this application, a person skilled in the art may understand that the noise generation circuit may be alternatively disposed in an AFCI in another device in the photovoltaic power generation system, or may be disposed in an AFCI in any other device or system (for example, a high-voltage direct current power source) in which an AFCI is disposed, so that impact imposed on an AFCI and a device of the AFCI because the noise generation circuit generates an arc noise signal in a non self-checking time can be avoided, to ensure normal working of the AFCI and the device of the AFCI.

Another aspect of this application further provides a self-checking circuit. The self-checking circuit may include the noise generation circuit in any one of the foregoing embodiments. Implementation principles and technical effects thereof are similar, and details are not described herein again.

Still another aspect of this application further provides an AFCI. The AFCI may include the foregoing self-checking circuit, and the self-checking circuit may include the noise generation circuit in any one of the foregoing embodiments. Implementation principles and technical effects thereof are similar, and details are not described herein again.

Still another aspect of this application further provides a photovoltaic power generation system. The photovoltaic power generation system may include the foregoing AFCI, and the AFCI may include the noise generation circuit in any one of the foregoing embodiments. Implementation principles and technical effects thereof are similar, and details are not described herein again.

What is claimed is:

1. A noise generation circuit, comprising a power switch module, a noise generator, and a capacitor, wherein the noise generator is connected to both the power switch module and the capacitor;

the power switch module is configured to control, according to a self-checking instruction, the noise generator; and the capacitor is configured to filter out a direct current component in the noise signal when the noise generator generates a noise signal, wherein the power switch module comprises a power source, a first resistor, a second resistor, a first switch, and a P-channel metal oxide semiconductor (PMOS) transistor; and a first terminal of the first resistor is connected to a first terminal of the first switch, a second terminal of the first switch is grounded, a third terminal of the first switch is connected to both a first terminal of the second resistor and a gate of the PMOS transistor, a second terminal of the second resistor and a source of the PMOS transistor are both connected to the power source, and a drain of the PMOS transistor is connected to the noise generator.

2. The noise generation circuit according to claim 1, wherein the power switch module further comprises a third resistor; and
 a first terminal of the third resistor is connected to both the first terminal of the first resistor and the first terminal of the first switch, and a second terminal of the third resistor is grounded.

3. The noise generation circuit according to claim 1, wherein the power switch module further comprises a fourth resistor; and
 a first terminal of the fourth resistor is connected to the third terminal of the first switch, and a second terminal of the fourth resistor is connected to both the first terminal of the second resistor and the gate of the PMOS transistor.

4. The noise generation circuit according to claim 1, wherein the first switch is a first NPN triode; and
 a base of the first NPN triode is the first terminal of the first switch, an emitter of the first NPN triode is the second terminal of the first switch, and a collector of the first NPN triode is the third terminal of the first switch.

5. The noise generation circuit according to claim 1, wherein the first switch is an N-channel metal oxide semiconductor NMOS transistor; and
 a gate of the NMOS transistor is the first terminal of the first switch, a source of the NMOS transistor is the second terminal of the first switch, and a drain of the NMOS transistor is the third terminal of the first switch.

6. The noise generation circuit according to claim 1, wherein the noise generator is a Zener diode; and
 a first terminal of the Zener diode is connected to both the drain of the PMOS transistor and a first terminal of the capacitor, and a second terminal of the Zener diode is grounded.

7. The noise generation circuit according to claim 6, wherein the power switch module further comprises a fifth resistor used for current limiting; and
 the first terminal of the Zener diode is connected to the drain of the PMOS transistor through the fifth resistor.

8. The noise generation circuit according to claim 1, wherein the noise generator is a second NPN triode; and
 an emitter of the second NPN triode is connected to the drain of the PMOS transistor, a base of the second NPN triode is connected to a first terminal of the capacitor, and a collector of the second NPN triode is not connected.

9. The noise generation circuit according to claim 8, wherein the power switch module further comprises a fifth resistor used for current limiting; and
 the emitter of the second NPN triode is connected to the drain of the PMOS transistor through the fifth resistor.

10. The noise generation circuit according to claim 1, wherein the noise generation circuit further comprises a sixth resistor and an operational amplifier; and
 a first terminal of the sixth resistor is grounded, a second terminal of the sixth resistor is connected to both a second terminal of the capacitor and a non-inverting input terminal of the operational amplifier, and an output terminal of the operational amplifier is connected to an inverting input terminal of the operational amplifier.

11. A self-checking circuit, comprising the noise generation circuit according to claim 1.

12. An arc fault circuit interrupter AFCI, comprising the self-checking circuit according to claim 11.

13. A photovoltaic power generation system, comprising the arc fault circuit interrupter AFCI according to claim 12.

* * * * *